(12) United States Patent
Najarian et al.

(10) Patent No.: US 6,670,914 B1
(45) Date of Patent: Dec. 30, 2003

(54) RF SYSTEM FOR REJECTION OF L-BAND JAMMING IN A GPS RECEIVER

(75) Inventors: Richard Najarian, Palos Verdes Estates, CA (US); Richard Keegan, Palos Verdes Estates, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/232,607

(22) Filed: Aug. 30, 2002

(51) Int. Cl.[7] .............................................. H04B 7/185
(52) U.S. Cl. .............................. 342/357.06; 342/357.12
(58) Field of Search ........................... 342/352, 357.02, 342/357.06, 357.12; 701/213, 215

(56) References Cited

U.S. PATENT DOCUMENTS

| | | | |
|---|---|---|---|
| 2002/0118729 A1 * | 8/2002 | Lomp et al. .................. | 375/146 |
| 2002/0120937 A1 * | 8/2002 | Chang ........................... | 725/68 |
| 2003/0064692 A1 * | 4/2003 | Shi ............................ | 455/232.1 |

* cited by examiner

*Primary Examiner*—Dao Phan
(74) *Attorney, Agent, or Firm*—Withrow & Terranova, PLLC

(57) ABSTRACT

The present invention provides a GPS receiver using a unique combination of fixed gain and variable gain amplifiers and signal quantization to achieve an integrated receiver that provides for GPS signal extraction with accurate position determination in the presence of interference at a signal level of −60 dBm. In general, the GPS receiver has downconversion circuitry that uses a first synthesizer output signal to reduce an amplified GPS signal to an intermediate frequency signal. Noise automatic gain control circuitry and a gain control circuit control a first variable amplifier and a second variable amplifier, respectively, such that the receiver continues to operate linearly and GPS information carried in the amplified GPS signal is not compressed. Digitization circuitry provides a baseband digitized signal representation of the GPS signal and for interference adaptation to maximize the signal-to-noise ratio of the digitized samples.

22 Claims, 2 Drawing Sheets

RF SYSTEM FOR REJECTION OF L-BAND JAMMING IN A GPS RECEIVER

CROSS-REFERENCE TO RELATED APPLICATIONS

This U.S. patent application is related to the following concurrently filed U.S. patent applications:
i) FREQUENCY PLAN FOR GPS RECEIVER by Najarian;
ii) INTEGRATED GPS RECEIVER ARCHITECTURE by Najarian et al.; and
iii) ALIAS SAMPLING FOR IF-TO-BASEBAND CONVERSION IN A GPS RECEIVER by Najarian et al., wherein these related U.S. patent applications are incorporated herein by reference in their entireties.

FIELD OF THE INVENTION

The present invention relates to GPS receivers, and particularly to a radio frequency system for use in GPS receivers that provides for GPS signal extraction in the presence of a much stronger interference signal.

BACKGROUND OF THE INVENTION

The global positioning system (GPS) is based on an earth-orbiting constellation of twenty-four satellite vehicles each broadcasting its precise location and ranging information. From any location on or near the earth, a GPS receiver with an unobstructed view of the sky should be able to track at least four satellite vehicles thereby being able to calculate the receiver's precise latitude, longitude, and elevation. Each satellite vehicle constantly transmits two signals, generally referred to as L1 and L2. The L1 signal from a satellite vehicle contains a unique pseudo-random noise code ranging signal with a chipping frequency of 1.023 MHz, system data with a bitrate frequency of 50 Hz, and an encrypted precise-code (y-code) with a chipping frequency of 10.23 MHz all being modulated onto a carrier frequency of 1575.42 MHz. The L2 signal consists of the system data and y-code being modulated onto a carrier frequency of 1227.60 MHz. In order to calculate a three-dimensional location, a receiver must determine the distance from itself to at least four satellite vehicles. This is accomplished by first determining the location of at least four satellite vehicles using ephemeris data received from the satellites. Once the locations of the satellites have been determined, the distance from the receiver to each of the satellites is calculated based upon an estimate of the receiver's position. The measurement of the distance from the receiver to a satellite is based on the amount of time that elapsed between the transmission of a ranging signal from each satellite vehicle and the reception of that chip symbol by the receiver. In particular, the estimated position of the receiver is then corrected based upon a time epoch associated with the received ranging signal.

The accuracy of a GPS receiver depends on the accuracy with which the receiver is capable of measuring the time that has elapsed between the broadcast of the range information by a satellite vehicle and the reception of the information by the receiver. There are several factors that reduce the accuracy of the time measurement in the receiver design, including the sampling bandwidth of the receiver, the number of sampling bits, errors caused by internally generated noise, and external interference. Additional system factors that cause reduction of accuracy include errors in the ephemeris data (location of the satellite), errors caused by delays due to the ionosphere and troposphere, and multipath errors caused by reflected signals entering the receiver antenna.

Additionally, GPS receivers must be able to extract a very weak GPS signal, typically −133 dBm, in the presence of a much stronger jamming interference signal such as a television, radio, or microwave signal. Accordingly, there is a need for radio frequency circuitry capable of receiving the weak GPS signal while rejecting the interference signal.

SUMMARY OF THE INVENTION

The present invention provides a GPS receiver using a unique combination of fixed gain and variable gain amplifiers and signal quantization to achieve an integrated receiver that provides for GPS signal extraction with accurate position determination in the presence of interfering signal levels of up to −60 dBm. In general, the GPS receiver has downconversion circuitry that uses a first synthesizer output signal to reduce an amplified GPS signal to an intermediate frequency signal. Noise automatic gain control circuitry controls a first variable amplifier to provide an amplified intermediate frequency signal to filtering circuitry, wherein the intermediate frequency signal is amplified such that the receiver continues to operate linearly and GPS information carried in the amplified GPS signal is not compressed. A gain control circuit controls a second variable amplifier to amplify a filtered intermediate frequency signal from the filtering circuitry to a level sufficient to be digitized by sampling circuitry before baseband processing. The digitization circuitry provides for interference adaptation to maximize the signal-to-noise ratio of the intermediate frequency signal samples.

In one embodiment, the GPS receiver further comprises a low noise amplifier, which is capable of linear operation while receiving a GPS signal in the presence of up to −60 dBm interference noise, and sampling circuitry adapted to digitize the filtered intermediate frequency signal before baseband processing. In another embodiment, the low noise amplifier, downconversion circuitry, the first and second variable amplifiers, and the sampling circuitry are integrated into a single semiconductor die preferably fabricated in a SiGe semiconductor process. Additionally, the downconversion circuitry, the first and second variable amplifiers, and the sampling circuitry may have differential inputs and outputs. The use of differential signals allows common mode rejection thereby suppressing the effects of received noise.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
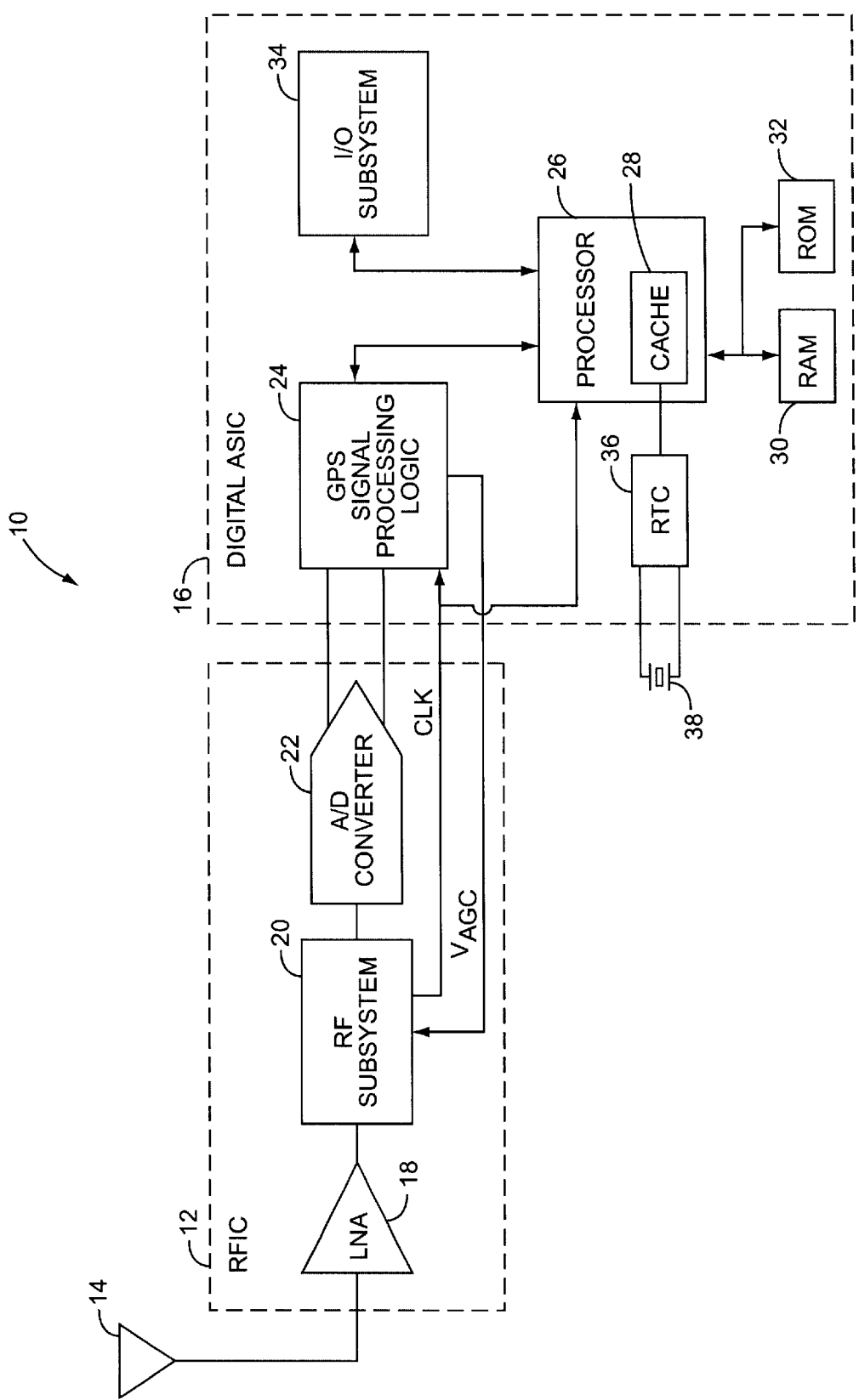
FIG. 1 depicts a simplified block diagram of a preferred embodiment of a GPS receiver according to the present invention.

The present invention is preferably incorporated in a GPS receiver 10. The basic architecture of a GPS receiver 10 is represented in FIG. 1 and may include a radio frequency integrated circuit (RFIC) 12, an antenna 14, and a digital application specific integrated circuit (ASIC) 16. The RFIC 12 receives information previously modulated on a radio frequency carrier from one or more satellite vehicles through antenna 14. A low noise amplifier (LNA) 18 amplifies the signal. A radio frequency (RF) subsystem 20 filters and downconverts the amplified signal while ensuring that the components of the RF subsystem 20 operate in their respective linear regions. An analog-todigital (A/D) converter 22 then digitizes the baseband analog signal into one or more digital streams. The RFIC 12 typically uses an automatic gain control (AGC) signal from the digital ASIC 16 to control signal levels presented to the A/D converter 22.

The digital ASIC 16 processes the digitized baseband signal to extract the information and data bits conveyed in the received signal. GPS signal processing logic 24 typically communicates with a processor 26 to perform such operations as demodulation, decorrelation, decoding, and error correction. The GPS signal processing logic 24 may also be operatively connected to the RF subsystem 20 such that an AGC signal ($V_{AGC}$) may be sent to the RF subsystem 20. The processor 26 may have either internal or external cache 28 in order to increase processing efficiency. The processor 26 is typically interfaced to random-access memory (RAM) 30 and read-only memory (ROM) 32. The random-access memory 30 is used by the processor 26 to store GPS related information such as ephemeris data, almanac data, last known position, etc. The read-only memory 32 stores program instructions to be executed by the processor 26. The processor 26 is also operatively connected to an input/output (I/O) subsystem 34 in order to communicate with external devices. Typically, a real-time clock (RTC) 36 driven by an oscillator 38 is operatively connected to the processor 26 to assist in position calculations performed by the processor 26.

Figure 2:
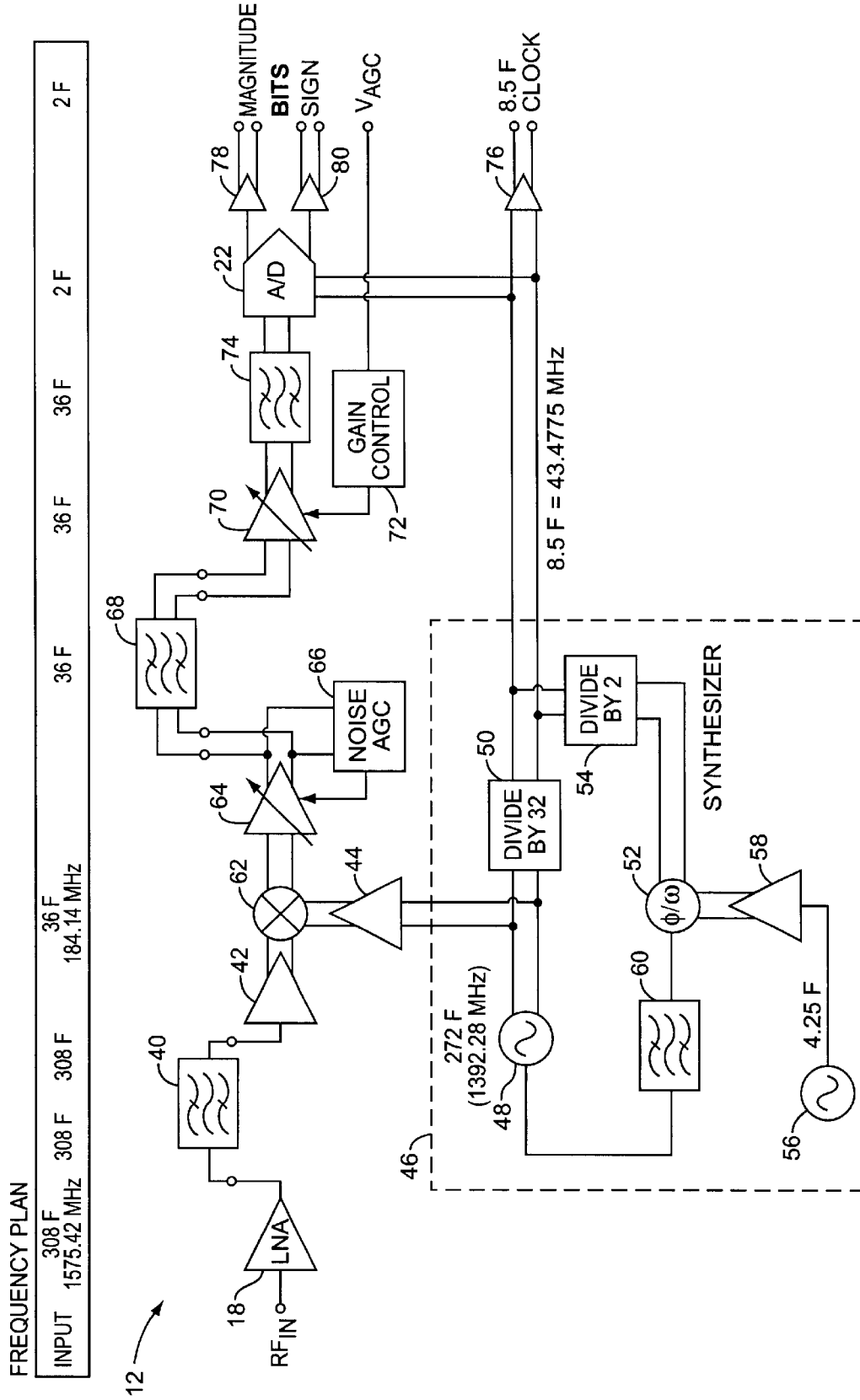
FIG. 2 depicts a detailed block diagram of a radio frequency system for use in a GPS receiver according to one embodiment of the present invention.

A schematic representation of one embodiment of the present invention is illustrated in FIG. 2. One embodiment of the present invention incorporates a unique frequency plan for the use of internally generated frequencies in a GPS receiver that are interrelated by nature, where no frequency in the RF-to-baseband conversion process may cause interference. The elimination of internal interference also allows the integration of an entire GPS receiver circuit onto a single chip, thereby reducing cost and also reducing the susceptibility of the receiver to external noise through the antennae effects of additional I/O between multiple chips. The unique frequency plan is based on a frequency F, which is defined as 5.115 MHz. Frequency F has integer multiples corresponding to the carrier frequencies of the L1 and L2 GPS signals, 1575.42 MHz and 1227.60 MHz, respectively. Hereafter, frequencies such as 308F and 36F represent the frequency equal to the integer coefficient multiplied by 5.115 MHz. For example, 308F represents the frequency 1575.42 MHz.

In FIG. 2, the L1 GPS signal having a center frequency of 308F is passed to the RFIC 12 from the antenna 14 as the RF input signal. A low noise amplifier 18 amplifies the signal. An external filter circuit 40 having a center frequency of 308F removes unwanted broadband interference. A first RF amplifier 42 amplifies the filtered, received signal while a second RF amplifier 44 amplifies a first synthesizer output signal having a center frequency of 272F from a synthesizer 46. The synthesizer 46 is comprised of a voltage controlled oscillator (VCO) 48, a divide by thirty-two circuit 50, a frequency and phase detector 52, a divide by two circuit 54, a reference oscillator 56 with an associated amplifier 58, and a filter 60 forming a phase-lock loop (PLL). The primary function of the synthesizer 46 is to regulate the voltage supplied to the VCO 48, thereby controlling the frequency and phase of the first synthesizer output signal of the synthesizer 46 and further controlling the frequency and phase of the output of the divide by thirty-two circuit 50, which is the second synthesizer output signal.

The frequency and phase detector 52 produces a signal proportional to the difference in the phases and/or frequencies of a first and second differential input. The first differential input of the frequency and phase detector 52 is the output signal of the divide by two circuit 54 whose input is the second synthesizer output signal having a center frequency of 8.5F. The second differential input of the frequency and phase detector 52 is the differential reference oscillator signal operating at 4.25F from the highly stable reference oscillator 56 after being amplified by amplifier 58. The signal created by the frequency and phase detector 52, which is proportional to the frequency and/or phase difference between the output signal of the divide by two circuit 54 and the reference oscillator signal, is shaped by the filter 60, thereby creating an output voltage. The output voltage of the filter 60 controls the VCO 48 thereby constantly correcting the first and second synthesizer output signals having center frequencies of 272F and 8.5F, respectively.

A mixer 62 in combination with the amplified first synthesizer output signal performs downconversion of the output signal of the first RF amplifier 42 to an intermediate frequency (IF) signal having a center frequency of 36F. A first variable amplifier 64 amplifies the IF signal. The gain of the first variable amplifier 64 is controlled by a signal from a noise AGC 66, which measures the average power at its inputs, such that the RFIC 12 continues to operate linearly. An external SAW filter 68 filters the amplified IF signal. In one embodiment of the invention and as shown in FIG. 2, the SAW filter 68 may have a center frequency of 36F in order to receive the L1 signal from the satellite vehicles. In another embodiment of this invention (not shown), the SAW filter 68 may have a center frequency of 32F in order to receive the L2 signal from the satellite vehicles. A second variable amplifier 70 amplifies the output signal of the SAW filter 68. The gain of the second variable amplifier 70 is controlled by the digital ASIC 16 using a $V_{AGC}$ signal to control a gain control circuit 72 such that the RFIC 12 continues to operate linearly and sufficient input power is supplied to the A/D converter 22.

In order to maintain the integrity of the received signal by preventing aliasing of unwanted frequencies during analog-to-digital conversion, an anti-aliasing filter 74 filters the output signal from the second variable amplifier 70. The second synthesizer output having a center frequency of 8.5F controls the sampling rate for the A/D converter 22 and provides a differential clock output 76. By sampling the anti-aliased signal at the frequency of 8.5F, the A/D converter 22 effectively acts as a downconverter, translating the anti-aliased signal having a center frequency of 36F to a digitized signal having a center frequency of 2F. The A/D converter 22 produces a digitized signal containing GPS information carried by the GPS signal and having a center frequency of 2F or 10.23 MHz, which corresponds to the fourth alias of the input signal. The digitized signal has a magnitude represented by a first differential output 78 and has a sign represented by a second differential output 80. The first differential output 78 and the second differential output 80 are operatively connected to the digital ASIC 16. Differential inputs and/or outputs are preferable for several components in FIG. 2 and are represented by two parallel lines. The use of differential inputs and outputs reduces the effects of external noise as is known by one having ordinary skill in the art.

Frequency Plan

One unique aspect of the present invention is a unique frequency plan that uses internally generated frequencies inside the GPS receiver 10 that are interrelated by nature, where no frequency in the RF-to-baseband conversion process may cause interference. This unique frequency plan allows for the integration of the RFIC 12, with the possible exception of the SAW filter 68, onto a single semiconductor die. The two key frequencies in the frequency plan are 8.5F and 272F. The use of these frequencies ensures that the odd and even harmonics of any internal signals produced by the GPS receiver 10 have a frequency of at least 10 MHz above or 10 MHz below the radio frequency input signal (either L1 or L2). For example, the L1 signal has a frequency of 308F (1575.42 MHz). It is readily seen that any odd or even harmonics of the 272F frequency are well outside the range of 308F ±10 MHz. As for the 8.5F signal, the harmonics with frequencies closest to the L1 signal are the thirty-sixth and thirty-seventh harmonics, which have frequencies of 306F and 314.5F, respectively. Again, these frequencies are outside the range of 308F ±10 MHz and will not interfere with the input signal.

FIG. 2 depicts one embodiment of the frequency plan as realized by the RFIC 12. The radio frequency input signal is the L1 signal, which has a frequency of 308F or 1575.42 MHz. After initial amplification and filtering, the L1 signal is downconverted to an intermediate frequency of 36F by the mixer 62 using the first synthesizer output signal having a center frequency of 272F. The intermediate frequency signal is passed through additional amplification and filtering stages until it reaches the A/D converter 22, where another unique advantage of generating the second synthesizer output signal having a center frequency of 8.5F becomes apparent. By sampling the intermediate frequency signal at a frequency of 8.5F, the A/D converter 22 essentially functions as a downconverter and digitizes only the fourth alias of the intermediate frequency signal, wherein the fourth alias has a center frequency of 2F (10.23 MHz). This preserves all data on the L1 signal.

Single Chip Heterodyne RFIC

Another embodiment of the present invention is a single heterodyne chip including the components of the RFIC 12, thereby eliminating the need for additional antenna gain and/or external amplifiers. This aspect of the current invention relies on the material used to fabricate the device and the gain-bandwidth product of bipolar transistors fabricated in the material.

In one embodiment of the present invention, the RFIC 12 is a single heterodyne chip preferably fabricated in a silicon germanium (SiGe) semiconductor process and includes the LNA 18 achieving sufficient gain and noise figure performance, thereby eliminating the need for any external gain, including any antenna gain. The bipolar transistors in the SiGe semiconductor have a gain-bandwidth product equal to or greater than that of transistors fabricated on more conventional materials such as GaAs (gallium arsenide) while at the same time operating at a much lower DC current bias. This lower DC current bias reduces the peak-to-peak AC content of AC signals (RF input signal, IF signal, etc.) in the RFIC 12 and thereby reduces magnetic and electrical coupling methods of propagation of the AC signal to critical circuit nodes, where such a signal would cause degradation or failure of circuit operation. These SiGe transistor properties, high gain-bandwidth product and low DC current bias, allow the RFIC 12 to perform at the high frequencies of the L1 and L2 signals while at the same time consuming a minimum amount of power, typically less than 75 mW. These properties allow high levels of RF system integration within the RFIC 12 while maintaining sufficient RF and IF gain to achieve optimum system performance in the GPS receiver 10, wherein the RFIC 12 includes the LNA 18, the mixer 62, the variable gain amplifiers 64 and 70, the anti-aliasing filter 74, and the A/D converter 22.

Rejection of L-Band Jamming

Yet another embodiment of the present invention is the ability to receive the very weak L1 or L2 signal, which is typically −133 dBm, in the presence of a much stronger jamming interference signal. The present invention uses fixed gain and variable gain amplifiers, filters, the unique frequency plan mentioned above, and SiGe technology to achieve satellite signal extraction with position accuracy in the presence of up to −60 dBm interference noise.

The first stage of the rejection of L-band jamming is achieved using the on-chip LNA 18. The LNA 18 is unique in that it avoids compression of the RF input signal in the presence of up to −60 dBm noise, is sensitive to the input signal, has sufficient gain at the L1 and L2 frequencies to drive the external filter 40, and is preferably fabricated in SiGe. For example, in one embodiment of the present invention, the RFIC 12 is fabricated in SiGe and the LNA 18 has a 1 dB compression point at −27 dBm, a 2 dB noise figure, and 23 dB gain. If the RF input signal to the LNA 18 is the L1 signal in the presence of −60 dBm noise, the fixed gain of 23 dB and the high 1 dB compression point of −27 dBm ensures that the LNA 18 operates linearly and the input signal is not compressed.

The next stage of the rejection of L-band jamming focuses on the first variable amplifier 64 and the noise AGC 66. After the RF input signal is converted to an IF signal, the gain of the first variable amplifier 64 is controlled by the noise AGC 66. The goal of this circuitry is to avoid compression of the signal by the first variable amplifier 64 and to achieve sufficient signal strength at the output of SAW filter 68 to avoid compression in the last stage of rejection.

The last stage of rejection focuses on the second variable amplifier 70 and the gain control circuit 72. Again, compression of the signal is avoided by using the gain control circuit 72, which is controlled by $V_{AGC}$ signal from the digital ASIC 16, to control the gain of the second variable amplifier 70. Further, the gain control circuit 72 is used to adjust the analog signal to an appropriate level for use by the A/D converter 22.

Alias Sampling

Another embodiment of the present invention is the use of the unique frequency plan mentioned above and the A/D converter 22 to convert the IF signal to a digitized baseband signal. The present invention uses a sampling rate for the A/D converter 22 that allows the in-phase (I) and quadrature phase (Q) components of the GPS modulation to be obtained directly from sampling the IF signal.

In one embodiment of the present invention, the IF signal has a frequency of 36F and is passed through the on chip anti-aliasing filter 74 before conversion. The anti-aliasing filter 74 is a narrowband filter used to remove unwanted frequencies from the IF signal thereby reducing the effects of aliasing during A/D conversion. The A/D converter 22 digitizes the anti-aliased IF signal with a sampling rate of 8.5F according to the frequency plan mentioned above. When receiving the L1 GPS signal, the 8.5F sampling rate produces aliases of the anti-aliased IF signal at frequencies of 36F plus or minus integer multiples of 8.5F. However, all aliases with a frequency greater than half of the sampling rate of 8.5F (4.25F) will be lost due to undersampling. Therefore, the present invention digitizes only the fourth alias of the 36F signal, which has a frequency of 2F (10.23 MHz). Similarly, the L2 GPS signal can be processed to obtain the digitized fourth alias at −2F of a corresponding 32F IF signal. Therefore, the output of the A/D converter 22 is a baseband digital representation of the received L1 or L2 signal and modulated data with a ±10.23 MHz center frequency. This baseband digital representation of the received L1 or L2 signal allows real signal (IF) processing of the digitized signal having sufficient information bandwidth (20 MHz ±2F) for optimum performance of the GPS receiver 10.

Those skilled in the art will recognize improvements and modifications to the preferred embodiments of the present invention. All such improvements and modifications are considered within the scope of the concepts disclosed herein and the claims that follow.

We claim:

1. A GPS receiver comprising:
   downconversion circuitry adapted to receive an amplified GPS input signal and a first synthesizer output signal and produce an IF signal from said amplified GPS input signal;
   a first variable amplifier operatively associated with said downconversion circuitry and noise automatic gain control circuitry, wherein said noise automatic gain control circuitry is adapted to control said first variable amplifier to ensure linear operation and avoid compression of said IF signal and provide an amplified IF signal to filtering circuitry; and
   a second variable amplifier adapted to amplify a filtered IF signal from said filtering circuitry and operatively associated with a gain control circuit adapted to control said second variable amplifier to control a level of said filtered IF signal, which is presented to sampling circuitry for digitization prior to baseband processing.

2. The GPS receiver according to claim 1 further comprising a low noise amplifier operatively associated before said downconversion circuitry and adapted to amplify a GPS input signal, which when filtered provides said amplified GPS input signal.

3. The GPS receiver according to claim 2 wherein said low noise amplifier is further adapted to receive said GPS input signal in the presence of up to −60 dBm interference.

4. The GPS receiver according to claim 2 wherein said low noise amplifier, said downconversion circuitry, said first variable amplifier, and said second variable amplifier are integrated into a single semiconductor die.

5. The GPS receiver according to claim 4 wherein said semiconductor die is fabricated in a SiGe semiconductor process.

6. The GPS receiver according to claim 1 wherein the sampling circuitry is operatively associated with said second variable amplifier and adapted to provide a digitized output signal including GPS information carried in said amplified GPS input signal.

7. The GPS receiver according to claim 6 wherein said downconversion circuitry, said first variable amplifier, said second variable amplifier, and said sampling circuitry are adapted to receive differential input signals to suppress received noise.

8. The GPS receiver according to claim 1 further comprising GPS signal processing logic adapted to receive said digitized output signal and perform baseband processing to extract said GPS information from said digitized output signal.

9. The GPS receiver according to claim 8 wherein said gain control circuit is operatively connected to said GPS signal processing logic wherein said GPS signal processing logic is further adapted to produce an automatic gain control voltage to drive said gain control circuit, wherein said automatic gain control voltage is used to maximize a signal-to-noise ratio of said digitized IF signal.

10. The GPS receiver according to claim 1 further comprising a frequency synthesizer operatively associated with said downconversion circuitry and adapted to produce said first synthesizer output signal.

11. The GPS receiver according to claim 1 further comprising filtering circuitry operatively associated between said first and second variable amplifiers, wherein said filtering circuitry is adapted to remove unwanted frequency components from said IF signal.

12. The GPS receiver according to claim 1 further comprising a SAW filter operatively associated between said first and second variable amplifiers, wherein said SAW filter is adapted to remove unwanted frequency components from said IF signal.

13. A semiconductor die comprising:
   downconversion circuitry adapted to receive an amplified GPS input signal and a first synthesizer output signal and produce an IF signal from said amplified GPS input signal;
   a first variable amplifier operatively associated with said downconversion circuitry and noise automatic gain control circuitry, wherein said noise automatic gain control circuitry is adapted to control said first variable amplifier to ensure linear operation and avoid compression of said IF signal and provide an amplified IF signal to filtering circuitry; and
   a second variable amplifier adapted to amplify a filtered IF signal from said filtering circuitry and operatively associated with a gain control circuit adapted to control said second variable amplifier to control a level of said filtered IF signal, which is presented to sampling circuitry for digitization prior to baseband processing.

14. The semiconductor die according to claim 13 further comprising a low noise amplifier operatively associated before said downconversion circuitry and adapted to amplify a GPS input signal, which when filtered provides said amplified GPS input signal.

15. The semiconductor die according to claim 14 wherein said low noise amplifier is further adapted to receive said GPS input signal in the presence of up to −60 dBm interference.

16. The semiconductor die according to claim 13 wherein the sampling circuitry is operatively associated with said second variable amplifier and adapted to provide a digitized output signal including GPS information carried in said amplified GPS input signal.

17. The semiconductor die according to claim 16 wherein said downconversion circuitry, said first variable amplifier, said second variable amplifier, and said sampling circuitry are adapted to receive differential input signals to suppress received noise.

18. The semiconductor die according to claim 16 wherein said gain control circuit is operatively connected to GPS signal processing logic, wherein said GPS signal processing logic is adapted to receive said digitized output signal and perform baseband processing to extract said GPS information from said digitized output signal and produce an automatic gain control voltage to drive said gain control circuit, wherein said automatic gain control circuit maximizes a signal-to-noise ratio of said digitized IF signal.

19. The semiconductor die according to claim 13 further comprising a frequency synthesizer operatively associated with said downconversion circuitry and adapted to produce said first synthesizer output signal.

20. The semiconductor die according to claim 13 further comprising external connections for filtering circuitry operatively associated between said first and second variable amplifiers, wherein said filtering circuitry is adapted to remove unwanted frequency components from said IF signal.

21. The semiconductor die according to claim 13 further comprising external connections for a SAW filter operatively associated between said first and second variable amplifiers, wherein said SAW filter is adapted to remove unwanted frequency components from said IF signal.

22. The semiconductor die according to claim 13 wherein said semiconductor die is fabricated in a SiGe semiconductor process.

* * * * *